(12) United States Patent
Willer et al.

(10) Patent No.: US 7,075,137 B2
(45) Date of Patent: Jul. 11, 2006

(54) SEMICONDUCTOR MEMORY HAVING CHARGE TRAPPING MEMORY CELLS

(75) Inventors: Josef Willer, Riemerling (DE); Christoph Ludwig, Langebruck (DE); Joachim Deppe, Dresden (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 163 days.

(21) Appl. No.: 10/890,803

(22) Filed: Jul. 14, 2004

(65) Prior Publication Data

US 2005/0045935 A1 Mar. 3, 2005

(30) Foreign Application Priority Data

Jul. 15, 2003 (DE) ................................ 103 32 095

(51) Int. Cl.
*H01L 27/108* (2006.01)

(52) U.S. Cl. ............... 257/298; 257/437; 257/E21.673; 257/E27.081; 438/72; 438/636; 438/736; 438/740

(58) Field of Classification Search ................ 257/437, 257/E21.673, E27.081; 438/72, 636, 736
See application file for complete search history.

(56) References Cited

U.S. PATENT DOCUMENTS

| 5,311,049 A | 5/1994 | Tsuruta |
| 5,583,808 A | 12/1996 | Brahmbhatt |
| 5,825,688 A | 10/1998 | Ueki |
| 6,713,315 B1 * | 3/2004 | Kuo et al. ................. 438/72 |

FOREIGN PATENT DOCUMENTS

DE        102 58 194 A1    7/2004

* cited by examiner

*Primary Examiner*—Mai-Huong Tran
(74) *Attorney, Agent, or Firm*—Slater & Matsil, L.L.P.

(57) ABSTRACT

In a charge trapping memory architecture for virtual ground with interconnects (6) that are present parallel to the word lines (2) and STI isolations (1) that are present parallel to the bit lines (4), provision is made of STI isolations (7) that are widened for division into slices. Instead of this, the interconnects present below a bit line may be omitted or two mutually adjacent bit lines (41, 42) may be wired up in such a way that the memory transistors present between them operate only in the dummy mode.

19 Claims, 2 Drawing Sheets

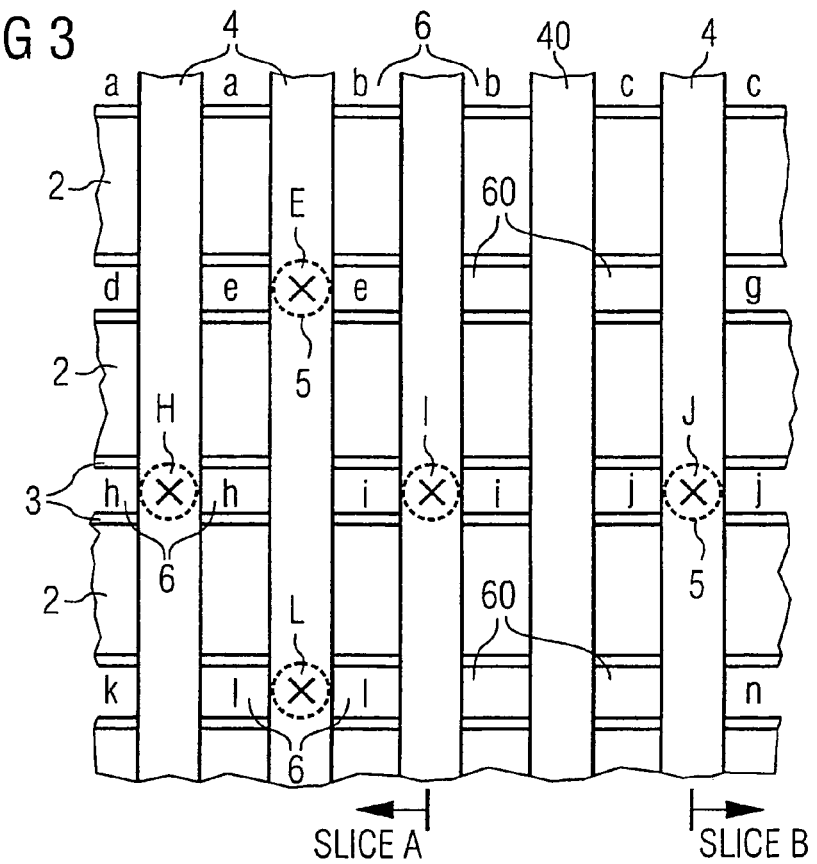
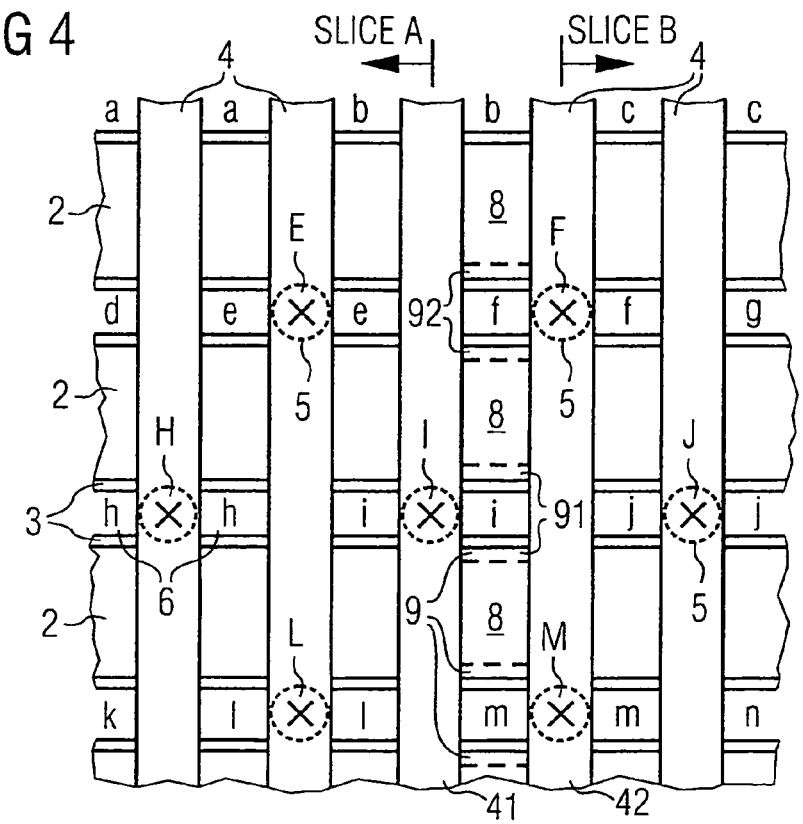

SEMICONDUCTOR MEMORY HAVING CHARGE TRAPPING MEMORY CELLS

This application claims priority to German Patent Application 103 32 095.4, which was filed Jul. 15, 2003 and is incorporated herein by reference.

TECHNICAL FIELD resent invention relates generally to a memories and more particularly to a semiconductor memory having charge trapping memory cells.

BACKGROUND

A memory cell has a memory transistor, which is provided with a gate electrode at a top side of a semiconductor body or a semiconductor layer. The gate electrode is arranged between a source region and a drain region, which are formed in the semiconductor material. The gate electrode is isolated from the semiconductor material by a dielectric material. In the case of a charge trapping memory cell, in particular a SONOS cell or NROM cell, a layer sequence comprising a storage layer provided for trapping charge carriers at source and drain between boundary layers is present at least between the source region and the gate electrode and between the drain region and the gate electrode. The material of the boundary layers has a higher energy band gap than the material of the storage layer, so that the charge carriers trapped in the storage layer between the boundary layers remain localized there.

A nitride is preferably taken into consideration as material for the storage layer. An oxide is principally suitable as the surrounding material. In the case of a memory cell in the material system of silicon, the memory cell in this example is silicon nitride with an energy band gap of about 5 eV, and the surrounding boundary layers are silicon oxide with an energy band gap of about 9 eV. The storage layer may be a different material with a smaller energy band gap than that of the boundary layers, the difference between the energy band gaps being intended to be as large as possible for good electrical confinement of the charge carriers. In conjunction with silicon oxide, it is less possible to use e.g., tantalum oxide, hafnium silicate, titanium oxide (in the case of stoichiometric composition $TiO_2$), zirconium oxide (in the case of stoichiometric composition $ZrO_2$), aluminum oxide (in the case of stoichiometric composition $Al_2O_3$) or intrinsically conducting (undoped) silicon as material of the storage layer. Silicon nitride has a relative permittivity of about 7.9. The use of an alternative material with a higher relative permittivity (e.g. $\approx 15 \ldots 18$) permits a reduction of the oxide-equivalent overall thickness of the layer stack provided for storage and is therefore advantageous.

SUMMARY OF THE INVENTION

In one aspect, the present invention specifies a semiconductor memory having charge trapping memory cells in a virtual ground architecture, which is divided into slices. In order to divide the semiconductor memory into slices, the periodically arranged series of memory transistors T between two successive relevant bit lines are interrupted at predetermined distances. It is the case then that either only insulation regions are present instead of the transistors, or the transistors present are not used as memory cells of the semiconductor memory.

In a first embodiment, instead of a transistor structure, an insulation is present between two successive bit lines in the semiconductor body or substrate. The insulation may, in particular, insulate the entire region between the adjoining STI isolations. In this case, the insulation, together with the adjoining STI isolations, forms an individual wider STI isolation.

As a further possibility, the sequence of interconnects can be interrupted below the relevant bit line. Instead of the interconnects, insulating regions are present below the relevant bit line, which insulating regions are preferably formed by virtue of the fact that the dielectric material which is provided for mutually insulating the interconnects is also introduced into the insulating regions. The bit line contacts may be omitted in the case of the relevant bit line. If the relevant bit line contacts are absent and a sufficient electrical insulation of the bit line is thereby effected, the interconnects may, if appropriate, be present below the relevant bit line.

A division of the semiconductor memory may also be performed in circuitry terms. The structure of the memory cell array can then be strictly periodic; the boundaries between the slices result only on account of the driving of the bit lines. This is done in this case such that a series of memory transistors are wired up as dummy memory cells, referred to as dummy mode memory cells hereinafter, between the two relevant bit lines.

BRIEF DESCRIPTION OF THE DRAWINGS

The invention will be explained in more detail in the following text using an exemplary embodiment. In the associated drawing figures:

FIG. 3 shows an arrangement scheme of the word lines, bit lines and interconnects and of the subdivision into slices for a second exemplary embodiment; and FIG. 4 shows an arrangement scheme of the word lines, bit lines and interconnects and of the subdivision into slices for a third exemplary embodiment.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

German patent application file ref. 10258194.0 describes a semiconductor memory having charge trapping memory cells in which the channel regions in each case run transversely with respect to the relevant word line and the bit lines are arranged on the top side of the word lines and in a manner electrically insulated from the latter. Electrically conductive interconnects are present in interspaces between the word lines and in a manner electrically insulated from the latter, and are connected to the bit lines in sections.

In accordance with a consecutive numbering of the memory transistors along a respective word line, said interconnects electrically conductively connect, on one side of the word line, in each case a source/drain region of an even-numbered memory transistor to a source/drain region of the subsequent odd-numbered memory transistor in said numbering and, on the opposite side of this word line, in each case a source/drain region of an odd-numbered memory transistor to a source/drain region of the subsequent even-numbered memory transistor in said numbering. The word lines can be contact-connected between the bit lines with word line straps which reduce the electrical bulk resistance.

Figure 1:
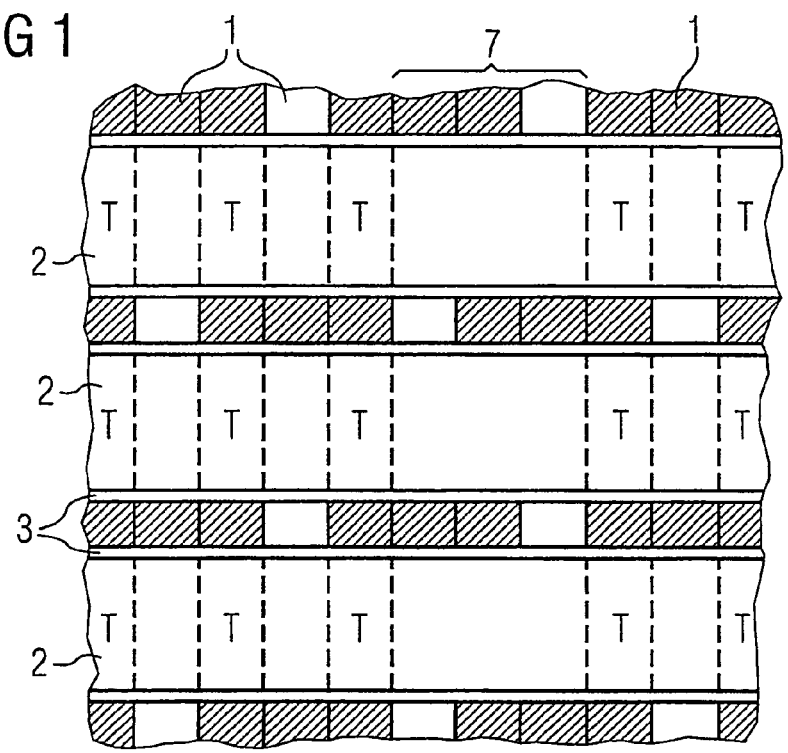
FIG. 1 shows an arrangement scheme of the STI isolations and word lines.

FIG. 1 shows a plan view of a scheme revealing the positions of the STI (shallow trench isolation) isolations 1, word lines 2 with lateral spacers 3 and the regions that are to be electrically conductively connected to one another. The STI isolations 1 represent a multiplicity of isolation trenches which are arranged parallel at a distance from one another and are preferably filled with an oxide of the semiconductor material. However, a different dielectric may also be present in the isolation trenches. The STI isolations are arranged parallel at a distance from one another. Channel regions of the memory transistors T that run parallel to the isolation trenches below each word line 2 are in each case present between said STI isolations. The word lines 2 therefore run over the channel regions arranged transversely with respect to the longitudinal direction of the word line.

The source/drain regions of the memory transistors T are in each case present in a manner laterally adjoining the word lines. The source/drain regions are electrically conductively connected to one another in the regions that are in each case identified in hatched fashion in FIG. 1, a short piece of the relevant isolation trench being bridged in each case.

Figure 2:
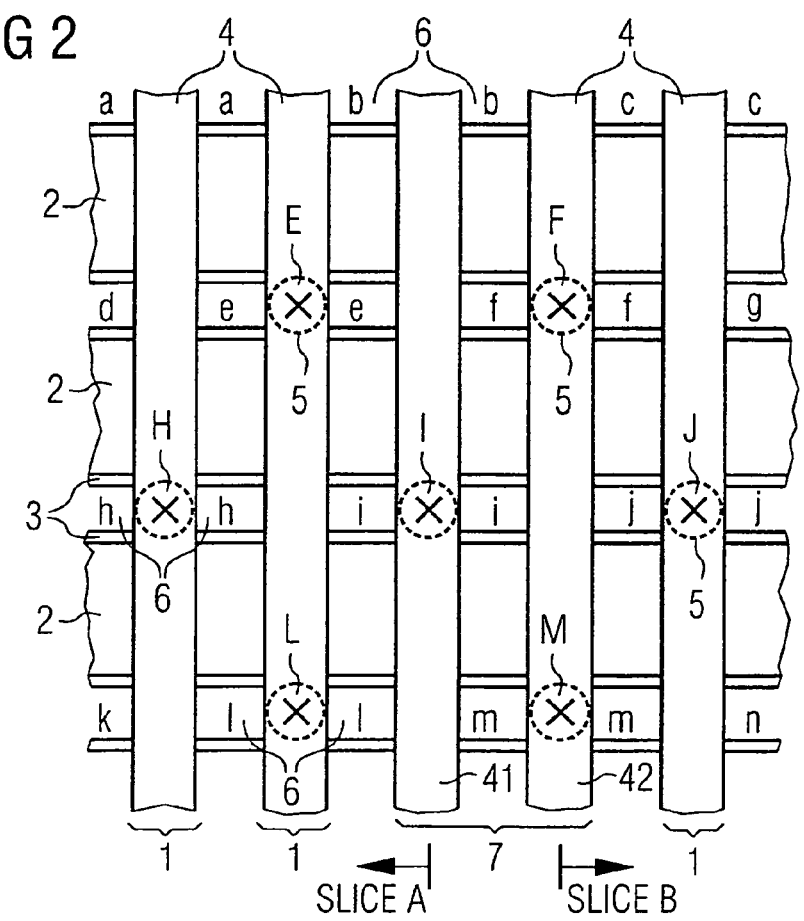
FIG. 2 shows an arrangement scheme of the word lines, bit lines and interconnects and of the subdivision into slices for a first exemplary embodiment.

FIG. 2 illustrates a plan view of this arrangement including the bit lines 4 applied above the word lines. The regions depicted in hatched fashion in FIG. 1 are covered with electrically conductive material, designated as interconnects hereinafter, and are in each case designated by the same lower-case letters in FIG. 2. The interconnects 6 are contact-connected by the bit lines 4. The bit line contacts 5 are depicted by broken lines as concealed contours in FIG. 2 and identified by a cross. Furthermore, the bit line contacts 5 are in each case designated by that upper-case letter which corresponds to the lower-case letter of the relevant interconnect 6.

It can be seen in FIG. 2 that the bit lines 4 are in each case electrically contact-connected at interconnects 6 which are arranged successively in the direction of the bit lines in each case in next but one interspaces between the word lines 2. The interconnects 6 in each case bridge an STI isolation 1 and connect a respective source/drain region to a subsequent source/drain region in the relevant interspace between the word line webs. They are electrically insulated from one another and therefore formed in sections and isolated from one another by dielectric material.

Semiconductor memories are subdivided into sections, so-called slices, which generally comprise 33 or 34 successive bit lines in the case of the memory architecture described here. Memory areas which typically comprise 33×256 or 33×512 memory cells are formed in this way. The slices have to be electrically isolated from one another and are provided for joint erasure of the memory cells present therein.

FIG. 1 illustrates a sectional plan view of an arrangement scheme of the STI isolations and word lines in the case of a first exemplary embodiment, in which a wider STI isolation 7 is present in the sequence of STI isolations 1 arranged parallel to one another. In other words, the identically spaced apart arrangement of memory transistors T is interrupted there. In accordance with FIG. 2, the bit lines 4 may be arranged at uniform distances on the top side of this structure. The relevant bit lines 41, 42 then serve for driving the memory transistors in slice A (bit line 41) and the memory transistors in slice B (bit line 42). There are no transistors present between said bit lines 41, 42. The wider STI isolation 7 forms a boundary between the slices A, B.

In order, during production, to achieve the situation that the active regions between the STI isolations are arranged on a uniform grid underlying the entire memory, that is to say the periodicity in the succession of the active regions remains constant across the boundaries of the slices and is interrupted there only once, the active regions respectively adjoining the wider STI isolation 7 may be made somewhat wider than the rest of the active regions. However, the active regions may also all have the same width if proximity effects that possibly occur during production, are suitably compensated for by the configuration of the mask used for patterning the STI isolations.

It is preferably done by means of assist lines in the mask. In the region of the STI isolations provided, the mask has openings which are wider at the boundaries of the slices, in accordance with the wider STI isolations provided there, than above the rest of the STI regions. Along the center of the wider openings, narrow portions of the mask are provided in each case, so-called assist lines, which are narrow enough in order, during the subsequent lithography, not to effect shielding in the region of the wider STI isolations, but provide for an exposure of the adjoining regions in the envisaged grid.

The exemplary embodiment described has the advantage that the division of the semiconductor memory into slices which are electrically insulated from one another can be carried out with a comparatively low outlay without significantly impairing the strict periodicity of the arrangement of the active regions. Consequently, the distribution of the threshold voltages of the memory transistors is essentially identical in comparison with the memory that is not subdivided into slices.

In the case of the exemplary embodiment in accordance with FIG. 3, the interconnects 6 are omitted below a relevant bit line 40. Only insulated regions 60 are present instead of the interconnects. The insulated regions 60 may preferably be formed by virtue of the fact that the dielectric material which is introduced into the interspaces between the word lines 2 for the purpose of electrically insulating the interconnects from one another is also introduced below the relevant bit line 40. This bit line 40 should preferably be connected to ground. The terminal contacts of the relevant bit line 40 are preferably omitted. If this suffices for an electrical insulation, the interconnects may possibly be present below said relevant bit line 40 and the terminal contacts of the bit line on the interconnects may possibly be omitted. The exemplary embodiment in which the relevant interconnects are omitted is preferred.

This exemplary embodiment has the advantage that the periodicity of the active regions provided with the transistor structures is not interrupted. The distribution of the threshold voltages of the memory transistors is narrowest in the case of this exemplary embodiment.

In the case of the exemplary embodiment in accordance with FIG. 4, the structure of the semiconductor memory is unchanged relative to the structure described in the German patent application noted above. A division of the semiconductor memory into slices that are electrically isolated from one another is effected exclusively by the wiring-up. Apart from the edge, the memory cell arrangement is periodic in the case of this exemplary embodiment. A series of memory transistors which are not as such used for storing information are situated between two relevant bit lines 41, 42 on the boundary between slice A and slice B. These memory transistors instead form dummy transistors or dummy mode memory cells 8. In the case of the charge trapping memory cells, it is possible to store bits at both channel ends through suitable polarity of the voltages present on the bit lines. In FIG. 4, the memory locations 9 are illustrated by the broken lines at the two ends of the transistor structures adjoining the source/drain regions.

Programming is effected by trapping hot charge carriers from the channel in the storage layer between the gate electrode, which is part of the respective word line, and the semiconductor material of the channel. Prior to the first erasure of a slice and in each case between the further erase operations, a bit is in each case programmed in the memory locations 9 of the dummy mode memory cells adjoining the slice to be erased, in order to prevent a so-called over-erase. Those memory locations of the dummy mode memory cells 8 are in each case programmed here whose respectively adjacent source/drain region is electrically conductively connected via an interconnect 6 to a source/drain region in the slice to be erased.

If, in the example illustrated in FIG. 4, slice A is intended to be erased, the memory locations 91 are thus programmed prior to the erasure since these memory locations are adjacent to a source/drain region which is connected via the interconnect i depicted to a further source/drain region within slice A. Correspondingly, the memory locations 92 are programmed prior to the erasure of slice B since these memory locations are adjacent to a source/drain region which is connected via the interconnect f depicted to a further source/drain region within slice B. During this programming, the outer bit line—adjoining the slice to be erased—of the adjacent slice, that is to say the bit line 42 in the event of erasure of slice A and the bit line 41 in the event of erasure of slice B is connected to 0 volts (ground).

The bits written in the dummy mode memory cells 8 are concomitantly erased during the subsequent erase operation. It is advantageous if the memory locations of the dummy mode memory cells 8 are reprogrammed directly after the erase operation, in order to minimize leakage currents that possibly occur and to avoid problems when reading the memory transistors arranged at the edge in slice A or slice B. The programming is preferably performed such that the threshold voltage increases greatly and the leakage currents through the transistor become very small.

The advantages of this exemplary embodiment are a small space consumption without interruption of the periodicity of the active regions, the interconnects and the bit line contacts and a very narrow fluctuation in the distribution of the threshold voltages of the memory transistors.

Although the present invention and its advantages have been described in detail, it should be understood that various changes, substitutions and alterations can be made herein without departing from the spirit and scope of the invention as defined by the appended claims.

What is claimed is:

1. A semiconductor memory having charge trapping memory cells, the memory comprising:
    a semiconductor body;
    memory transistors formed the semiconductor body, each memory transistor having a channel region between source and drain regions, a gate electrode and a dielectric storage layer sequence between the gate electrode and the channel region;
    isolations regions disposed in the semiconductor body, the isolation regions arranged at a distance from one another in a longitudinal direction of the channel regions, the isolation regions located between the memory transistors;
    bit lines arranged along the isolation regions;
    word lines arranged in rows running transverse with respect to the bit lines and in a manner electrically insulated from the bit lines at a distance from one another, the gate electrode each memory transistor being electrically coupled to a relevant word line, wherein the longitudinal direction of a channel region runs transversely with respect to the relevant word line associated with that channel region;
    electrically conductive interconnects coupling ones of the bitlines to ones of the source and drain regions of the memory transistors; and
    an electrical insulation disposed between two successive isolation regions between relevant bit lines in order to divide the semiconductor memory into slices at predetermined distances between two successive relevant bit lines.

2. The semiconductor memory as claimed in claim 1 wherein the bit lines are arranged above a top side of the word lines that is remote from the semiconductor body or substrate.

3. The semiconductor memory as claimed in claim 1 wherein the electrically conductive interconnects are arranged in sections in interspaces between the word lines and electrically insulated therefrom, wherein the interconnects are numbered in accordance with a consecutive numbering of the memory transistors along a respective word line such that
    a) on one side of the word line, the interconnects electrically couple a source/drain region of an even-numbered memory transistor to a source/drain region of the subsequent odd-numbered memory transistor in said numbering, and
    b) on the opposite side of this word line, the interconnects electrically couple a source/drain region of an odd-numbered memory transistor to a source/drain region of the subsequent even-numbered memory transistor in said numbering, and
    the bit lines are in each case electrically contact-connected at interconnects that are arranged successively in the direction of the bit lines in each case in next but one interspaces between the word lines.

4. The semiconductor memory as claimed in claim 3, wherein an electrical insulation of a bit line from the interconnects is connected by virtue of the fact that said bit line is formed without contacts to the interconnects.

5. The semiconductor memory as claimed in claim 1, wherein the electrical insulation is effected between two successive isolation regions by virtue of the fact that the two successive isolation regions and a region present between them are formed together as a wider isolation region.

6. The semiconductor memory as claimed in claim 4, wherein the electrical insulation is disposed below two successive bit lines.

7. The semiconductor memory as claimed in claim 4, wherein the isolation regions comprise STI regions.

8. A semiconductor memory having charge trapping memory cells, the memory comprising:
    a semiconductor body;
    memory transistors formed the semiconductor body, each memory transistor having a channel region between source and drain regions, a gate electrode and a dielectric storage layer sequence between the gate electrode and the channel region;
isolations regions disposed in the semiconductor body, the isolation regions arranged at a distance from one another in a longitudinal direction of the channel regions, the isolation regions located between the memory transistors;
bit lines arranged along the isolation regions;
word lines arranged in rows running transverse with respect to the bit lines and in a manner electrically insulated from the bit lines at a distance from one another, the gate electrode each memory transistor being electrically coupled to a relevant word line, wherein the longitudinal direction of a channel region runs transversely with respect to the relevant word line associated with that channel region; and
electrically conductive interconnects coupling the bit lines to the source and drain regions of the memory transistors, wherein an interruption of the sequence of interconnects that is present along the word lines below a relevant bit line and/or an electrical insulation of the relevant bit line from the interconnects is provided in order to divide the semiconductor memory into slices at predetermined distances along the relevant bit line.

9. The semiconductor memory as claimed in claim 8 wherein the bit lines are arranged above a top side of the word lines that is remote from the semiconductor body or substrate.

10. The semiconductor memory as claimed in claim 8 wherein the electrically conductive interconnects are arranged in sections in interspaces between the word lines and electrically insulated therefrom, wherein the interconnects are numbered in accordance with a consecutive numbering of the memory transistors along a respective word line such that
    a) on one side of the word line, the interconnects electrically couple a source/drain region of an even-numbered memory transistor to a source/drain region of the subsequent odd-numbered memory transistor in said numbering, and
    b) on the opposite side of this word line, the interconnects electrically couple a source/drain region of an odd-numbered memory transistor to a source/drain region of the subsequent even-numbered memory transistor in said numbering, and
    the bit lines are in each case electrically contact-connected at interconnects that are arranged successively in the direction of the bit lines in each case in next but one interspaces between the word lines.

11. The semiconductor memory as claimed in claim 10, wherein an electrical insulation of a bit line from the interconnects is connected by virtue of the fact that said bit line is formed without contacts to the interconnects.

12. The semiconductor memory as claimed in claim 8, wherein the interruption of the sequence of interconnects that is present along the word lines below a bit line is effected by virtue of the fact that electrically insulated regions are present instead of the interconnects in the region of said bit line.

13. A semiconductor memory having charge trapping memory cells, the memory comprising:
    a semiconductor body;
    memory transistors formed the semiconductor body, each memory transistor having a channel region between source and drain regions, a gate electrode and a dielectric storage layer sequence between the gate electrode and the channel region;
    isolations regions disposed in the semiconductor body, the isolation regions arranged at a distance from one another in a longitudinal direction of the channel regions, the isolation regions located between the memory transistors;
    bit lines arranged along the isolation regions;
    word lines arranged in rows running transverse with respect to the bit lines and in a manner electrically insulated from the bit lines at a distance from one another, the gate electrode each memory transistor being electrically coupled to a relevant word line, wherein the longitudinal direction of a channel region runs transversely with respect to the relevant word line associated with that channel region;
    electrically conductive interconnects coupling the bit lines to the source and drain regions of the memory transistors;
    a series of memory transistors inserted between two successive relevant bit lines for the purpose of electrically isolating the memory transistors present on both sides of said series in order to divide the semiconductor memory into slices at predetermined distances between the two successive relevant bit lines.

14. The semiconductor memory as claimed in claim 13 wherein the bit lines are arranged above a top side of the word lines that is remote from the semiconductor body or substrate.

15. The semiconductor memory as claimed in claim 13 wherein the electrically conductive interconnects are arranged in sections in interspaces between the word lines and electrically insulated therefrom, wherein the interconnects are numbered in accordance with a consecutive numbering of the memory transistors along a respective word line such that
    a) on one side of the word line, the interconnects electrically couple a source/drain region of an even-numbered memory transistor to a source/drain region of the subsequent odd-numbered memory transistor in said numbering, and
    b) on the opposite side of this word line, the interconnects electrically couple a source/drain region of an odd-numbered memory transistor to a source/drain region of the subsequent even-numbered memory transistor in said numbering, and
    the bit lines are in each case electrically contact-connected at interconnects that are arranged successively in the direction of the bit lines in each case in next but one interspaces between the word lines.

16. The semiconductor memory as claimed in claim 15, wherein an electrical insulation of a bit line from the interconnects is connected by virtue of the fact that said bit line is formed without contacts to the interconnects.

17. The semiconductor memory as claimed in claim 13, wherein:
    a wiring-up of the bit lines is provided in such a way that, between the two successive bit lines, the series of memory transistors is provided as dummy mode memory cells;
    the dummy mode memory cells each have a memory location at two ends of the channel region that in each case place a source/drain region adjacent to a relevant memory location, and
    at least prior to each erasure of one of the slices, which are isolated by said series, by means of the relevant bit lines, those memory locations of the dummy mode memory cells are programmed whose respectively adjacent source/drain region is electrically conductively connected via an interconnect to a source/drain region in the slice to be erased.

18. The semiconductor memory as claimed in claim 17, wherein the memory locations of the dummy mode memory cells are already programmed after each erasure of one of the adjoining slices.

19. A semiconductor memory having charge trapping memory cells, the memory comprising:

a semiconductor body;

memory transistors formed the semiconductor body, each memory transistor having a channel region between source and drain regions, a gate electrode and a dielectric storage layer sequence between the gate electrode and the channel region;

isolations regions disposed in the semiconductor body, the isolation regions arranged at a distance from one another in a longitudinal direction of the channel regions between the memory transistors;

bit lines arranged along the isolation regions;

word lines arranged in rows running transverse with respect to the bit lines and in a manner electrically insulated from the bit lines at a distance from one another, the gate electrode each memory transistor being electrically coupled to a relevant word line, wherein the longitudinal direction of a channel region runs transversely with respect to the relevant word line associated with that channel region, and wherein the bit lines are arranged above a top side of the word lines that is remote from the semiconductor body or substrate;

electrically conductive interconnects arranged in sections in interspaces between the word lines and electrically insulated therefrom, wherein the interconnects are numbered in accordance with a consecutive numbering of the memory transistors along a respective word line such that a) on one side of the word line, the interconnects electrically couple a source/drain region of an even-numbered memory transistor to a source/drain region of the subsequent odd-numbered memory transistor in said numbering, and b) on the opposite side of this word line, the interconnects electrically couple a source/drain region of an odd-numbered memory transistor to a source/drain region of the subsequent even-numbered memory transistor in said numbering, and the bit lines are in each case electrically contact-connected at interconnects that are arranged successively in the direction of the bit lines in each case in next but one interspaces between the word lines;

wherein in order to divide the semiconductor memory into slices at predetermined distances along a relevant bit line or between two successive relevant bit lines a) an electrical insulation is present between two successive isolation regions between the relevant bit lines, or b) an interruption of the sequence of interconnects that is present along the word lines below the relevant bit line and/or an electrical insulation of the relevant bit line from the interconnects is present, or c) a wiring-up of the bit lines is provided in such a way that, between two successive relevant bit lines, a series of memory transistors is inserted for the purpose of electrically isolating the memory transistors present on both sides of said series.

* * * * *

UNITED STATES PATENT AND TRADEMARK OFFICE
CERTIFICATE OF CORRECTION

| | | |
|---|---|---|
| PATENT NO. | : 7,075,137 B2 | |
| APPLICATION NO. | : 10/890803 | |
| DATED | : July 11, 2006 | |
| INVENTOR(S) | : Willer et al. | |

It is certified that error appears in the above-identified patent and that said Letters Patent is hereby corrected as shown below:

In the Specification:

Column 1, Line 10:    Delete "resent" and insert --The present--.

Signed and Sealed this

Third Day of October, 2006

JON W. DUDAS
*Director of the United States Patent and Trademark Office*